(12) United States Patent
Peng

(10) Patent No.: US 6,273,484 B1
(45) Date of Patent: Aug. 14, 2001

(54) WAFER HOLDING DEVICE

(75) Inventor: Jui-Hung Peng, Hsinchu (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/452,772

(22) Filed: Dec. 1, 1999

(30) Foreign Application Priority Data

Oct. 29, 1999 (TW) ................................................ 88118755

(51) Int. Cl.$^7$ .................................................... B25J 15/10
(52) U.S. Cl. ........................ 294/86.4; 294/1.1; 414/941; 34/58
(58) Field of Search .................................. 294/1.1, 86.4, 294/106; 414/935, 936, 941; 134/149, 157, 902; 34/58

(56) References Cited

U.S. PATENT DOCUMENTS

| | | | |
|---|---|---|---|
| 4,651,440 | * | 3/1987 | Karl ........................................... 34/58 |
| 5,851,041 | * | 12/1998 | Anderson et al. ..................... 414/941 |
| 5,954,072 | * | 9/1999 | Matusita ................................ 414/941 |
| 5,974,681 | * | 11/1999 | Gonzalez-Martin ...................... 34/58 |
| 6,167,893 | * | 1/2001 | Taatjes et al. ............................. 34/58 |

\* cited by examiner

*Primary Examiner*—Dean Kramer
(74) *Attorney, Agent, or Firm*—Beyer Weaver & Thomas LLP

(57) ABSTRACT

The present invention relates to a wafer holding device comprising a rotatable base and a plurality of weighted-jaws pivotally coupled on the base. Each of the weighted-jaws is provided with a step portion, used to support and clamp the wafer, and a pendulum weight. The pendulum weight can be integrally formed or detachably hanged on the jaw, depending on the size of the wafer clamped. As the base is rotated at a predetermined velocity, the pendulum weights sway out of the axis of the base due to the centrifugal force generated by the rotation, thereby clamping the wafer in the step portions. The preferred embodiment of the present invention can further provide a stopper formed on the base and a spring connected between the base and each of the jaws so as to keep limit the movement of the jaws within predetermined range.

19 Claims, 6 Drawing Sheets

WAFER HOLDING DEVICE

BACKGROUND OF THE INVENTION

1. Field of the Invention

This invention relates to a substrate holding device. In particular, this invention relates to a wafer holding device provided with a rotatable plate pivoted with jaws to effectively clamp a wafer thereon by means of centrifugal force.

2. Description of Prior Art

Referring to FIG. 1, a side view depicts the structure of a wafer W rotated by a wafer holding device 1 to perform the cleaning process according to the prior art.

As shown in FIG. 1, the wafer holding device 1 comprises a base 10, a vacuum pump 12 and a motor M. The base 10 is a supporting plate used to support wafer W and is rotated above an axis A—A by the motor M. A sucking portion 100 formed on the top surface of the base 10 is a concavity communicated to the vacuum pump 12 by a channel 13. Wafer W is placed on the sucking portion 100 of the base 10 and sucked by the vacuum pump 12 and rotated with the base 10 above the axis A—A. Given the acting force of the flushing water during the cleaning, the contact and suction between the wafer W and the base 10 must be well maintained to prevent disengagement of the wafer W during the rotation.

FIG. 2A is top view of a wafer holding device 2 according to the second prior art, and FIG. 2B is front view showing the structure of the wafer holding device 2 according to FIG. 2A. As shown in FIG. 2B, the holding device 2 of a second example of the prior art comprises a rotatable base 20, a plurality of pins 21 used to support the wafer W and a motor M used to actuate the base 20. The pins 21 are spaced apart from each other and mounted on the upper surface of the base 20, symmetrically and vertically. Each of the pins 21 is provided with a step portion 210 composed of surfaces 211, 212 and the wafer W is limited and clamped therebetween. The fit and clearance of the wafer W set between the pins 21 should be accurately calculated, otherwise the wafer W easily disengages from the pins 21 when the base 20 is rotated above the axis A—A at a high speed.

SUMMARY OF THE INVENTION

To solve the above problems, the primary object of this invention is to provide a wafer holding device to effectively clamp the wafer while it is rotated during the cleaning process. The wafer holding device of the present invention comprises a base used to rotate about an axis with a predetermined velocity and a plurality of jaws coupled to the base. The jaws are pivotally mounted on the circumference of the base and each is reciprocally moved between a first position and a second position. Each of the jaws has a holding surface for supporting the wafer at the first position as well as clamping the wafer at the second position, wherein the jaws move to the second position by means of centrifugal force generated by the rotation of the base at the predetermined velocity.

BRIEF DESCRIPTION OF THE DRAWINGS

The present invention can be more fully understood by reading the subsequent detailed description and examples with reference made to accompanying drawings in which.

DETAILED DESCRIPTION OF THE PREFERRED EMBODIMENTS

Figure 1:
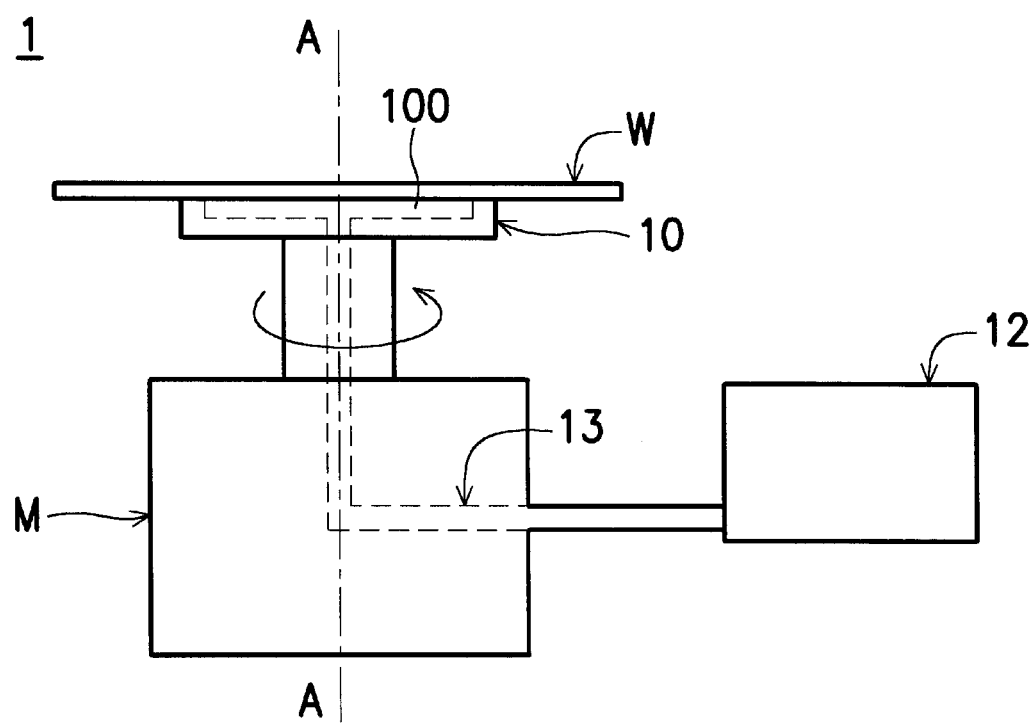
FIG. 1 is a side view showing the structure of a wafer W rotated by a wafer holding device (1) to perform the cleaning process according to a first example of the prior art.
Figure 2A:
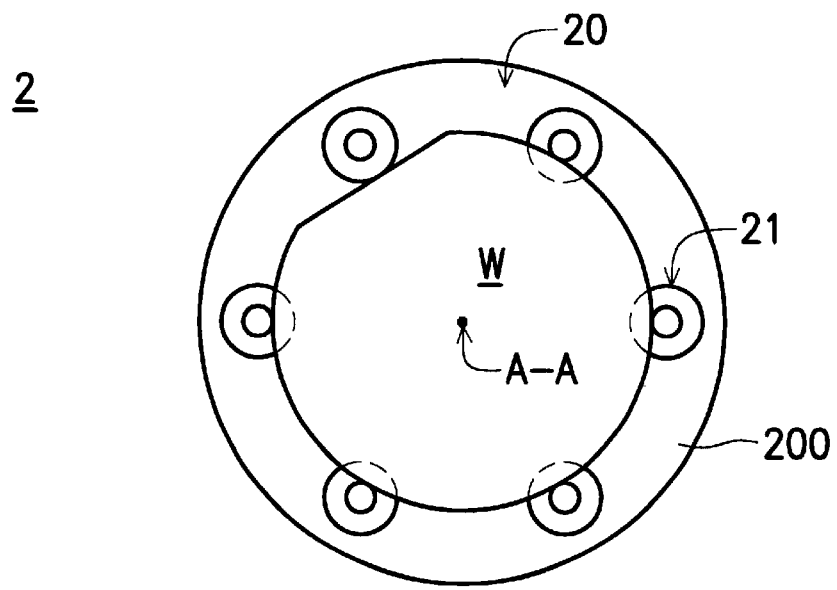
FIG. 2A is a top view of a wafer holding device (2) according to a second example of the prior art.
Figure 2B:
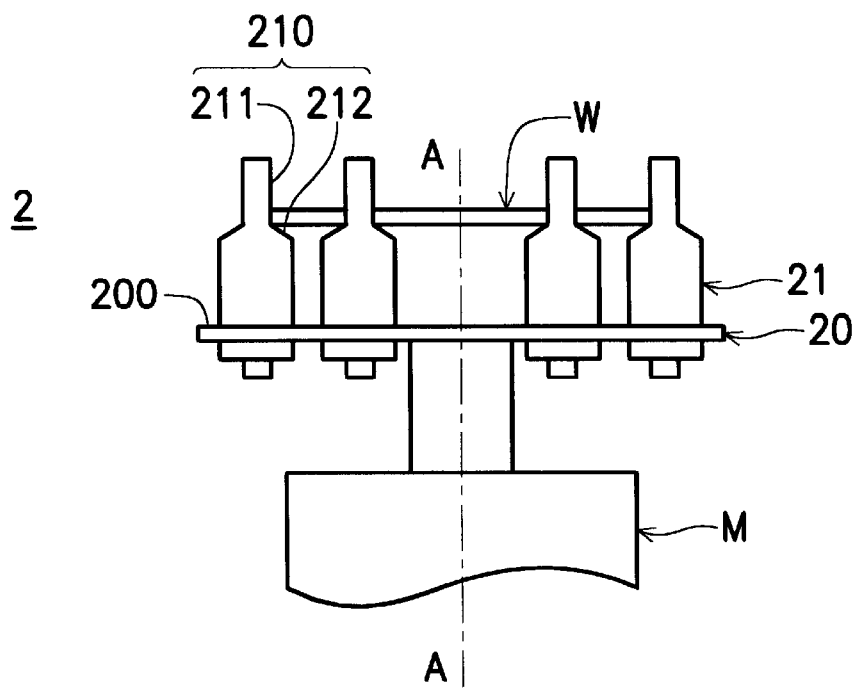
FIG. 2B is a front view showing the structure of the wafer holding device (2) according to FIG. 2A.
Figure 3A:
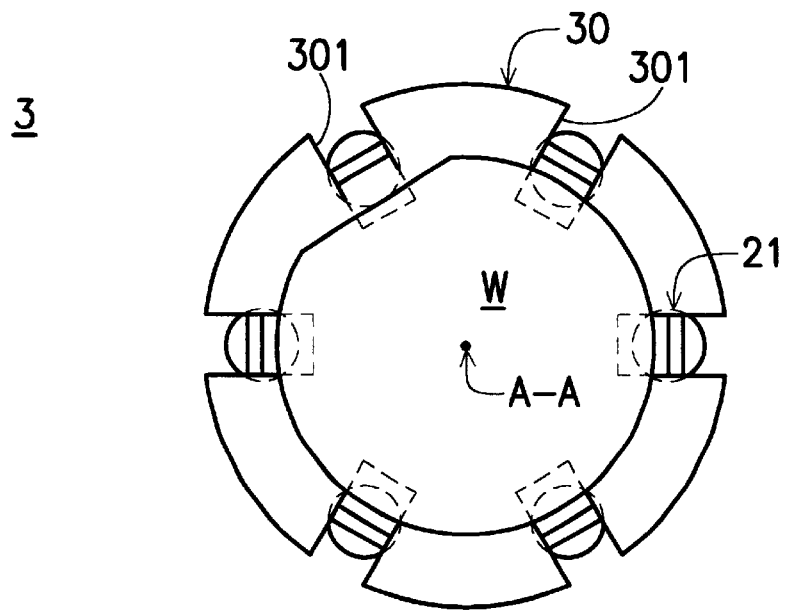
FIG. 3A is a top view of a wafer holding device (3) according to the first embodiment of present invention.
Figure 3B:
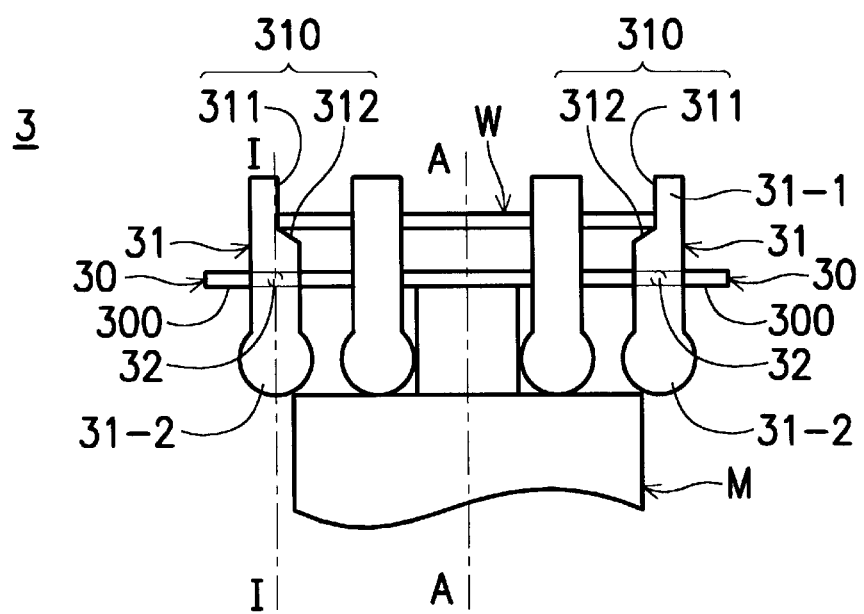
FIG. 3B is front view showing the structure of the wafer holding device (3) at a standstill state.

FIG. 3A is a top view of a holding device 3 according to the first embodiment of present invention, and FIG. 3B is front view showing the structure of the holding device 3 at a standstill state. A wafer W or an object to be clamped is initially placed above the holding device 3.

As shown in FIG. 3B, the wafer holding device 3 comprises a base 30, a plurality of weighted jaws 31 and a motor M. The base 30 is a rotatable plate actuated by the motor M and rotated above the axis A—A, and a plurality of notches 301 radially formed on the circumference of the base 30 are used to allocate the weighted jaws 31 respectively, as shown in FIG. 3A. Each of weighted jaws 31 is coupled on the base 30 by a pivot 32 and has a first end 31-1 and a second end 31-2 respectively located above and under of the base 30. The first end 31-1 of each of weighted jaws 31 is provided with a step portion 310 used to support the wafer W, and the second end 31-2 of each of weighted jaws 31 is provided with a pendulum weight. Hence, each of the jaws 31 is naturally located along the line I—I which is parallel to the axis A—A, and all the step portions 310 of the jaws 31 can be symmetrically and uniformly located at the predetermined position. The pendulum weight can be integrally formed or detachably hanged on the jaw 31, depending on the size of the wafer W or the object clamped. In this preferred embodiment, the pendulum weight is integrally formed on the second end 31-2 of the jaw 31. When the base 30 is static and the wafer W is commonly supported by each step portions 310 of the jaws 31, the situation of the static jaw 31 is defined as a first position, i.e., the line I—I.

Figure 4:
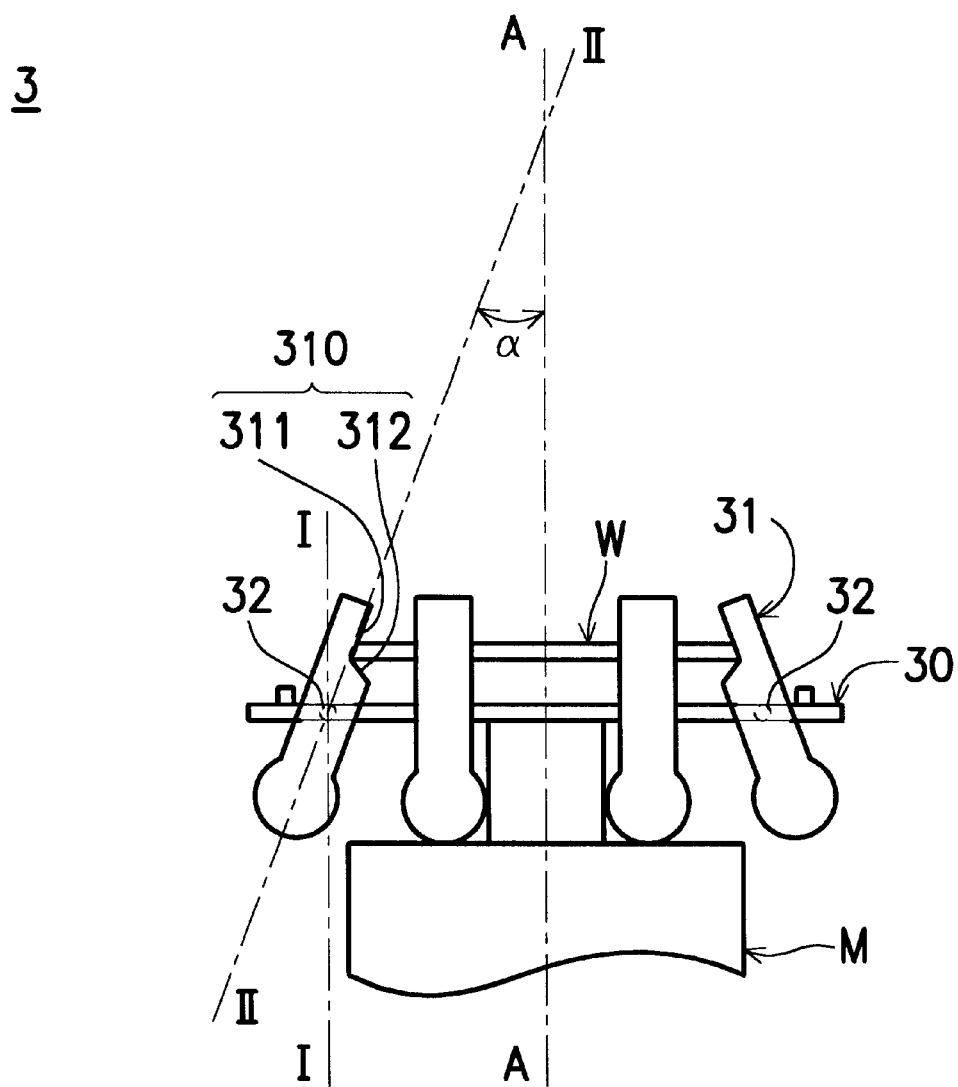
FIG. 4 is a side view showing the wafer holding device (3) being actuated.

Referring to FIG. 4, a side view shows the wafer holding device 3 is actuated and the wafer W is clamped by the jaws 31. As the base 30 is rotated by the motor M from a standstill state to a predetermined velocity, the pendulum weight of each of jaws 31 is uniformly swayed out of the axis A—A about the pivot 32 by the centrifugal force generated by the rotation. The wafer W can be properly clamped by the step portions 310 of the jaws 31 as they are synchronically converged toward to the axis A—A and located along the line II—II, i.e. the second position, at an angle α with the axis A—A. Therefore, the wafer W can be held tightly and rotated with the base 30 and the jaws 31 at a high speed to perform the cleaning process.

Figure 5A:
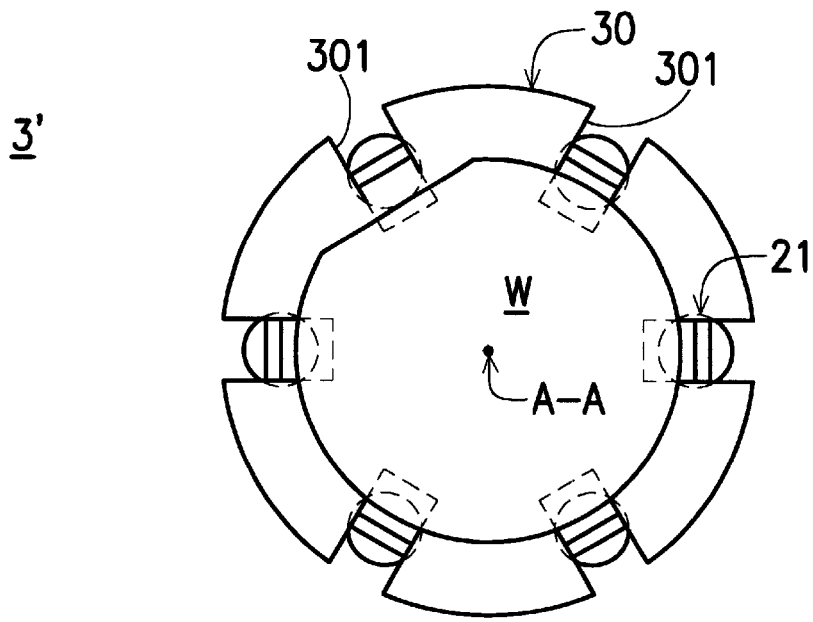
FIG. 5A is top view of a wafer holding device (3') according to the second embodiment of present invention.
Figure 5B:
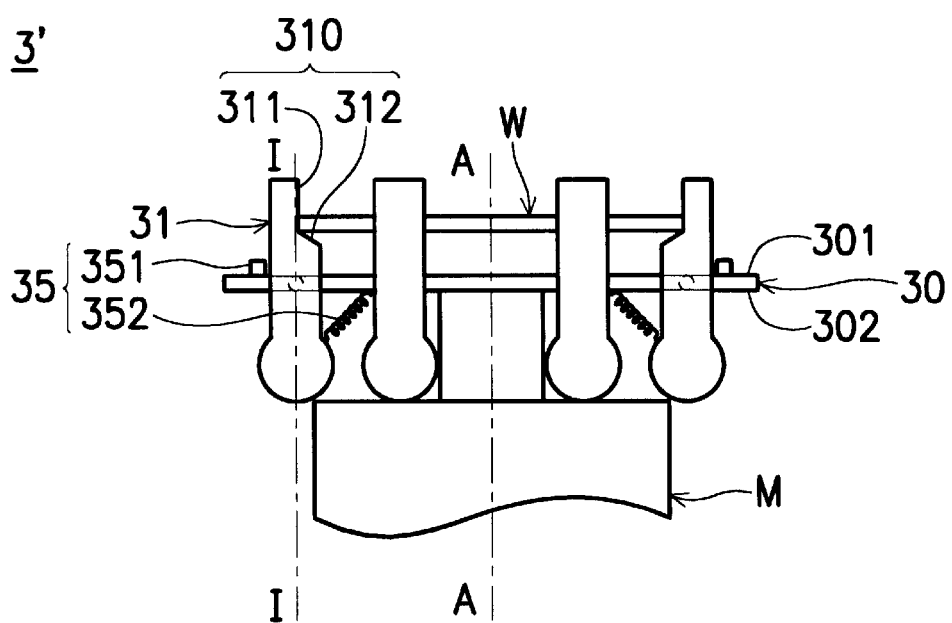
FIG. 5B is a front view showing the structure of the wafer holding device (3') at a standstill state.

FIG. 5A and FIG. 5B depict a wafer holding device 3' according to the second embodiment of present invention. The difference between the wafer holding device 3' and the wafer holding device 3 is that a limiting device 35 is applied. Hereinafter the same elements as in the aforementioned embodiment are noted with the same symbols.

As shown in FIG. 5B, the limiting device 35 comprises a plurality of stoppers 351 and springs 352. Each of the stoppers 351 is formed on the upper surface 301 of the base 30 with respect to a corresponding jaw 31, and each of the springs 352 is connected between the base 30 and the corresponded jaw 31. One end of the spring 352 is fixed on the lower surface 302 of the base 30 and the other end of the spring 352 is fixed on the pendulum weight of the corresponding jaw 31.

Figure 6:
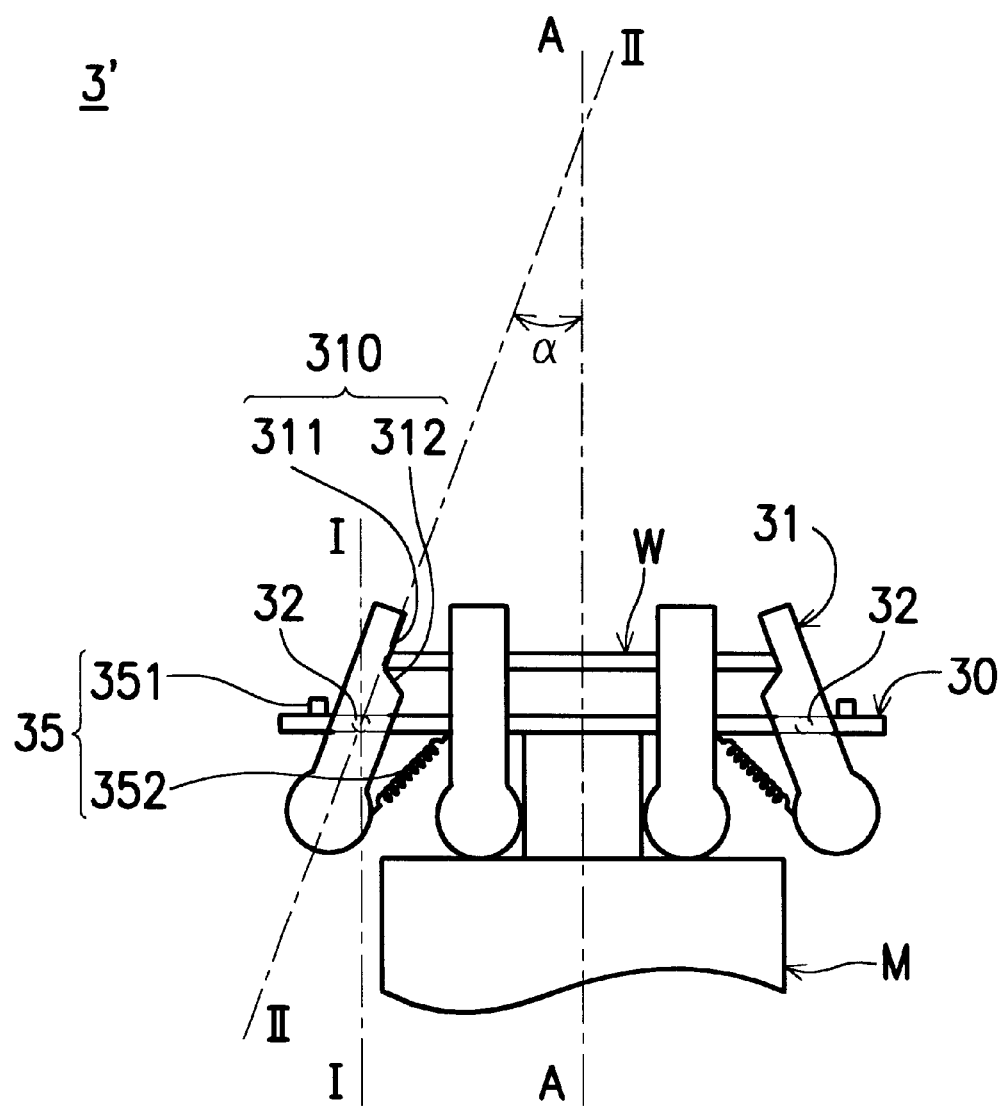
FIG. 6 is side view showing the wafer holding device (3') being actuated.

Referring to FIG. 6, as the motor M rotates the base 30 at a predetermined velocity, the pendulum weight of each of jaws 31 is uniformly swayed out about the pivot 32 and the wafer W can be properly clamped by the step portions 310 of the jaws 31. The index of the spring 352 can be designed to limit the clamping force of the jaws 31 to properly hold the wafer W without damage when the base 30 is rotated at a higher speed. When the rotated base 30 is stopped, the stoppers 351 can prevent the jaws 31 from exceeding the first position I—I and keep the wafer W properly situated among the step portions 310 of all the jaws 31.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An apparatus for holding an object with centrifugal force while said object is rotated, comprising:
   a base rotatable about an axis with a predetermined velocity; and
   at least one jaw coupled to said base and reciprocally movable between a first open position when the base is static and a second position, said jaw having a holding surface for receiving and supporting said object at the first position and for clamping said object at the second position by means of centrifugal force when said base is rotated at the predetermined velocity.

2. The apparatus as claimed in claim 1, wherein said jaw is pivotally coupled on the circumference of said base.

3. The apparatus as claimed in claim 2 further comprising a weight portion mounted on said jaw, wherein the centrifugal force generated by the rotation of said base causes said weight portion to move from the first position to the second position when said base is sped up to the predetermined velocity.

4. The apparatus as claimed in claim 3, wherein said weight portion is integrally formed on said jaw.

5. The apparatus as claimed in claim 4 further comprising a limiting device so as to limit said jaw's movement between the first position and the second position, said limiting device comprising a stopper formed on said base and a spring used to connect between said base and said jaw.

6. The apparatus as claimed in claim 5, wherein said object is a substrate.

7. The apparatus as claimed in claim 6, wherein said object is a wafer.

8. An apparatus for holding an object with centrifugal force while said object is rotated, comprising:
   a base rotatable about an axis with a predetermined velocity;
   a plurality of jaws coupled to said base and reciprocally movable between a first position when the base is static and a second position, each of said jaws having a supporting surface for supporting said object at the first position and for clamping said object at the second position, wherein each of said jaws is provided with a weighted portion for moving said jaw to the second position by means of centrifugal force generated by rotation of said base at the predetermined velocity; and
   a limiting device installed on said base so as to limit said jaw's movement between the first position and the second position.

9. The apparatus as claimed in claim 8, wherein each of said jaws is pivotally coupled on the circumference of said base, and the centrifugal force generated by the rotation of said base causes each of said jaws to move from the first position to the second position when the rotation is sped up to the predetermined velocity.

10. The apparatus as claimed in claim 9, wherein said limiting device comprises a stopper formed on said base and a spring connected between each of said jaws and said base.

11. The apparatus as claimed in claim 10, wherein said object is a substrate.

12. The apparatus as claimed in claim 11, wherein said object is a wafer.

13. The apparatus as claimed in claim 8, wherein the first position is an open position in which said object may be freely received by said holding surfaces.

14. A holding device for clamping a substrate as it is being rotated, comprising:
    a base rotatable about an axis with a predetermined velocity;
    a plurality of jaws pivotally coupled to said base respectively and used to hold said substrate, each of said jaws being reciprocally movable between a first position when the base is static and a second position, and each having a holding surface used for supporting said substrate at the first position and for clamping said object at the second position, wherein said jaws are moved to the second position by centrifugal force generated by the rotation of said base at the predetermined velocity; and
    a limiting device comprising a spring connected between each of said jaws and said base so as to limit each of said jaw's movement between the first position and the second position.

15. The holding device as claimed in claim 14 further comprising a weight portion mounted on each of said jaws, wherein the centrifugal force generated by the rotation of said base moves said weight portion between the first position to the second position when said base is sped up to the predetermined velocity.

16. The holding device as claimed in claim 15, wherein said weight portion is integrally formed on each of said jaws.

17. The apparatus as claimed in claim 16, wherein said limiting device further comprises a stopper formed on said base.

18. The apparatus as claimed in claim 17, wherein said substrate is a wafer.

19. The holding device as claimed in claim 14, wherein the first position is an open position in which said substrate may be freely received by said holding surfaces.

* * * * *